US010037804B1

(12) United States Patent
Buchanan et al.

(10) Patent No.: US 10,037,804 B1
(45) Date of Patent: Jul. 31, 2018

(54) ADJUSTING TARGET VALUES OF RESISTIVE MEMORY DEVICES

(71) Applicant: Hewlett Packard Enterprise Development LP, Houston, TX (US)

(72) Inventors: Brent Buchanan, Fort Collins, CO (US); Le Zheng, Palo Alto, CO (US); John Paul Strachan, San Carlos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/418,040

(22) Filed: Jan. 27, 2017

(51) Int. Cl.
G11C 11/00 (2006.01)
G11C 13/00 (2006.01)
G06F 17/16 (2006.01)

(52) U.S. Cl.
CPC .......... *G11C 13/0069* (2013.01); *G06F 17/16* (2013.01)

(58) Field of Classification Search
CPC ............................ G11C 13/0069; G06F 17/16
USPC ....... 365/46, 55, 74, 97, 100, 131, 148, 158, 365/171, 173, 163
See application file for complete search history.

(56) References Cited

U.S. PATENT DOCUMENTS

| 9,152,827 | B2 | 10/2015 | Linderman et al. |
| 2014/0006753 | A1* | 1/2014 | Gopal ........................ H04L 9/28 712/221 |
| 2014/0172937 | A1* | 6/2014 | Linderman .............. G06G 7/16 708/607 |
| 2016/0284400 | A1 | 9/2016 | Yakopcic et al. |
| 2017/0010831 | A1* | 1/2017 | Siau .......................... G11C 8/08 |

FOREIGN PATENT DOCUMENTS

WO WO-16099438 6/2016

OTHER PUBLICATIONS

Agarwal, S. et al., Energy Scaling Advantages of Resistive Memory Crossbar Based Computation and Its Application to Sparse Coding, (Research Paper), Jan. 6, 2016, 13 Pgs.
Alibart, A., Pattern Classification by Memristive Crossbar Circuits with Ex-situ and In-situ Training, (Research Paper), Jun. 10, 2013, 2 Pgs.

* cited by examiner

*Primary Examiner* — Fernando Hidalgo
(74) *Attorney, Agent, or Firm* — Hewlett Packard Enterprise Patent Department

(57) ABSTRACT

Examples disclosed herein relate to programming a first conductance of a first resistive memory device based on a first target value. The first conductance of the first resistive memory device is measured to determine a deviation of the first resistive memory device from the first target value. A second target value of a second resistive memory device is adjusted based on the deviation, and a second conductance of the second resistive memory device is programmed based on the adjusted second target value.

19 Claims, 7 Drawing Sheets

ADJUSTING TARGET VALUES OF RESISTIVE MEMORY DEVICES

BACKGROUND

Matrices are arrays of elements of any suitable size, and these elements may represent data, relationships between data values, transformations to be applied to data, and more. Owing to their flexibility and utility, matrices are used in a wide range of real-world applications. In computing examples, matrices are used to store and manipulate sensor data for controlling automated manufacturing, scientific data for research and modeling, demographic data, other statistical data, and other data types. Matrices are also used extensively in computer graphics. For example, a bitmap is a specific type of matrix in which each entry is a pixel value. As a further example, a digital filter for image processing may be represented as a matrix in which each entry is a transformation to be applied to a portion of an image or frame. A wide body of algebraic operations have been developed to manipulate and analyze matrices and their contents, and because they are utilized with such frequency, computing systems may include dedicated hardware for handling matrices and performing these operations.

BRIEF DESCRIPTION OF THE DRAWINGS

Certain examples are described in the following detailed description with reference to the drawings, of which:

FIG. 4 is a diagram of a first matrix and a second matrix upon which a mathematical operation is performed according to some examples of the present disclosure.

DETAILED DESCRIPTION OF SPECIFIC EXAMPLES

Figure 1:
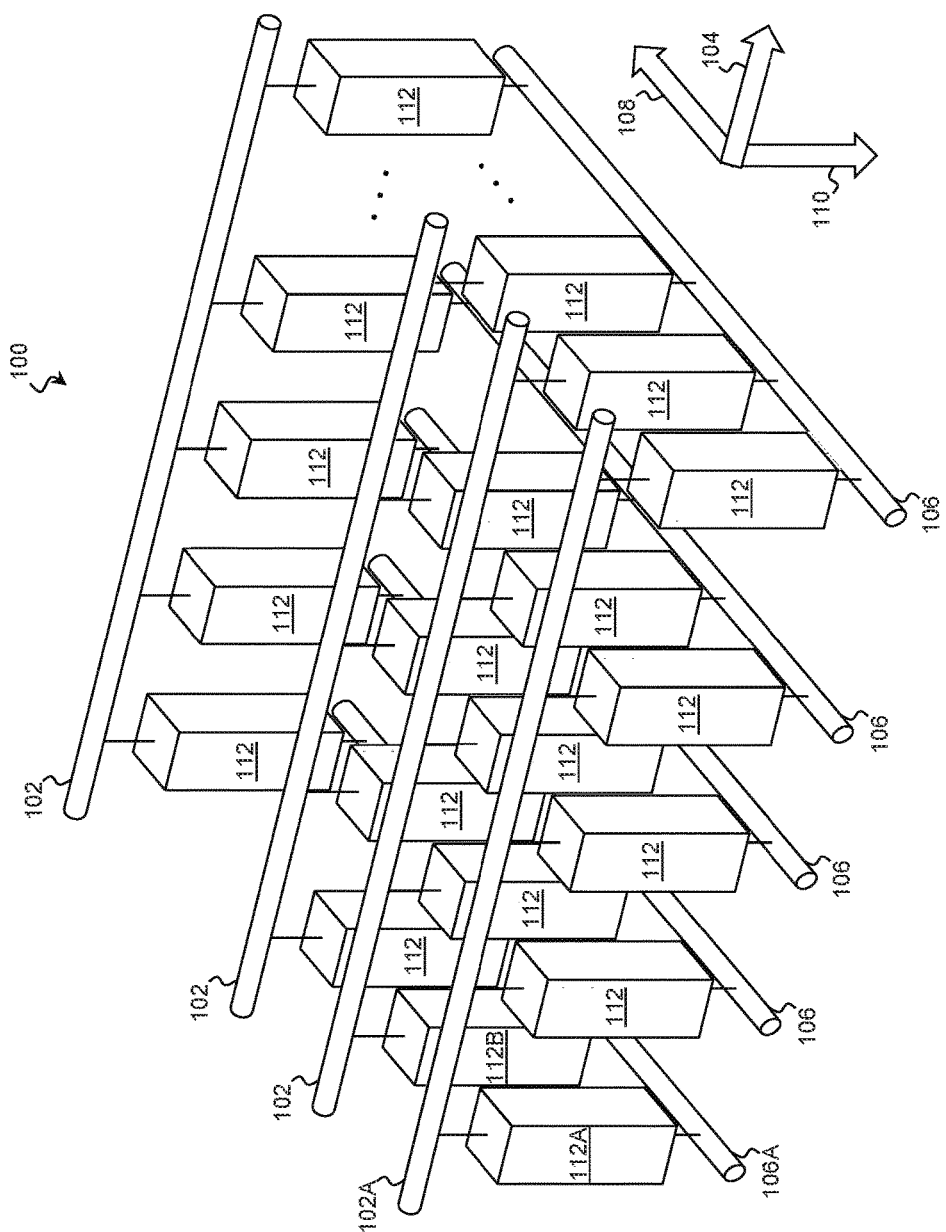
FIG. 1 is a perspective diagram of a crossbar circuit according to some examples of the present disclosure.

Many computing processors operate on matrices and matrix data, and for this purpose, a processor may include dedicated circuitry for matrix algebra. It has been determined that some matrix operations, including convolution, may be performed using resistive memory devices (e.g., memristors). To do so, a resistive memory device may be programmed to have a specific resistance, and inversely a specific conductance, by applying a write voltage to the resistive memory device. The programmed conductance may be read by applying a read voltage to the resistive memory device.

In an example, a first matrix value is encoded in the conductance of a resistive memory device. A second matrix value is encoded in the read voltage applied to the resistive memory devices. As the current through a resistive memory device is the product of the read voltage and the conductance, the magnitude of the current represents the product of the matrix values encoded in the voltage and the conductance. Multiple resistive memory devices may be combined in order to perform more complicated operations. For example, by electrically coupling multiple resistive memory devices to a common output, the combined current through the resistive memory devices at the common output represents the sum of the products. Such an arrangement thereby performs a multiply-and-accumulate operation. In turn, by combining groups of resistive memory devices in multiply-and-accumulate configurations, operations such as convolution may be performed.

However, due to manufacturing variations, parasitic effects, neighboring circuit interference, and other effects, programming a resistive memory device to have a particular conductance may be time consuming, if it can be achieved at all. In some examples, programming may include multiple iterations of applying a write voltage, measuring the conductance, and applying another write voltage to correct the conductance. To reduce programming time in some examples, a deviation from a target conductance in one resistive memory device is compensated for by adjusting the target conductance of another resistive memory device. This has the effect of relaxing the programming precision. By accepting conductance deviation and other noise in one device and correcting for it in another, these examples may reduce conductance programming time without significantly impacting accuracy of the mathematical operation. In some such examples, accuracy is actually improved by remedying otherwise uncorrectable deviation.

By these mechanisms and others, the present disclosure provides substantial real-world improvements to matrix coprocessors. For instance in many examples, a set of resistive memory devices are arranged electrically to perform multiple mathematical operations in parallel and at high speeds. Thus, the present disclosure provides a fast and efficient processor. To decrease programming time, in some such examples, a deviation of one resistive memory device from a target conductance is corrected for by adjusting a target conductance of another resistive memory device. The relaxed programming precision reduces programming time and/or improves accuracy by compensating for the deviation.

These examples and others are described with reference to the following figures. Unless noted otherwise, these figures and their accompanying description are non-limiting, and no element is characteristic of any particular example. In that regard, features from one example may be freely incorporated into other examples without departing from the spirit and scope of the disclosure. Terms such as "horizontal", "vertical", "above", "below", "on top of", "beside", etc. are used in the interest of clarity and do not indicate a specific position and/or orientation. Rather, the terms are used to distinguish relative position and/or orientation.

FIG. 1 is a perspective diagram of a crossbar circuit 100 according to some examples of the present disclosure. The crossbar circuit 100 includes a first set of address lines 102 of a first type. The first set of address lines 102 may represent word lines, bit lines, or any other suitable type of address line. In the illustrated examples, the first set of address lines 102 extend horizontally in a first direction 104 and are substantially parallel to one another.

The crossbar circuit 100 also includes a second set of address lines 106 of a second type that is complementary to the first type. For example, if the first set of address lines 102 are word lines, the second set of address lines 106 may be bit lines and vice-versa. The second set of address lines 106 may extend horizontally in a second direction 108 substantially perpendicular to the first and are substantially parallel to one another. The second set of address lines 106 may be offset from the first set of address lines 102 in a vertical direction 110. The lines of the first set of address lines 102 and the second set of address lines 106 may include conductive material such as copper, aluminum, titanium, tantalum, tungsten, ruthenium, platinum, tin, silver, gold, lead, other metals and alloys thereof, metal oxides, metal nitrides, metal carbides, and/or other conductive materials.

Resistive memory devices 112 may extend in the vertical direction 110 between the first set of address lines 102 and the second set of address lines 106 and are electrically coupled to one line of the first set of address lines 102 and one line of the second set of address lines 106. In particular, each resistive memory device 112 may be electrically coupled between a unique combination of one line of the first set of address lines 102 and one line of the second set of address lines 106 so that each resistive memory device 112 is uniquely addressable via the coupled lines. For example, resistive memory device 112A is electrically coupled to line 102A of the first set of address lines 102 and to line 106A of the second set of address lines 106 and is uniquely addressable using lines 102A and 106A. In this way, the lines of the first set of address lines 102 and the second set of address lines 106 may be electrically coupled to a plurality of resistive memory devices 112, yet each resistive memory device 112 remains independently addressable. In these examples and others, a voltage may be applied to a particular resistive memory device 112 using the line of the first set of address lines 102 and the line of the second set of address lines 106 to which the resistive memory device 112 is electrically coupled.

Each resistive memory device 112 may be programmed independently using the coupled lines to have a specified electrical property such as conductance. However, setting a conductance state of a resistive memory device 112 with precision may involve multiple iterations of programming and verifying the conductance state. Furthermore, even setting a resistive memory device 112 to a target conductance exactly does not rule out other sources of conductance deviation such as variations in address lines, capacitive coupling between lines, etc. Accordingly, in some examples, measured deviation of a first resistive memory device 112A is corrected by adjusting a target conductance of a second resistive memory device 112B. This may reduce the number of programming and verifying iterations and may compensate for deviations that may be otherwise uncorrectable.

Figure 2:
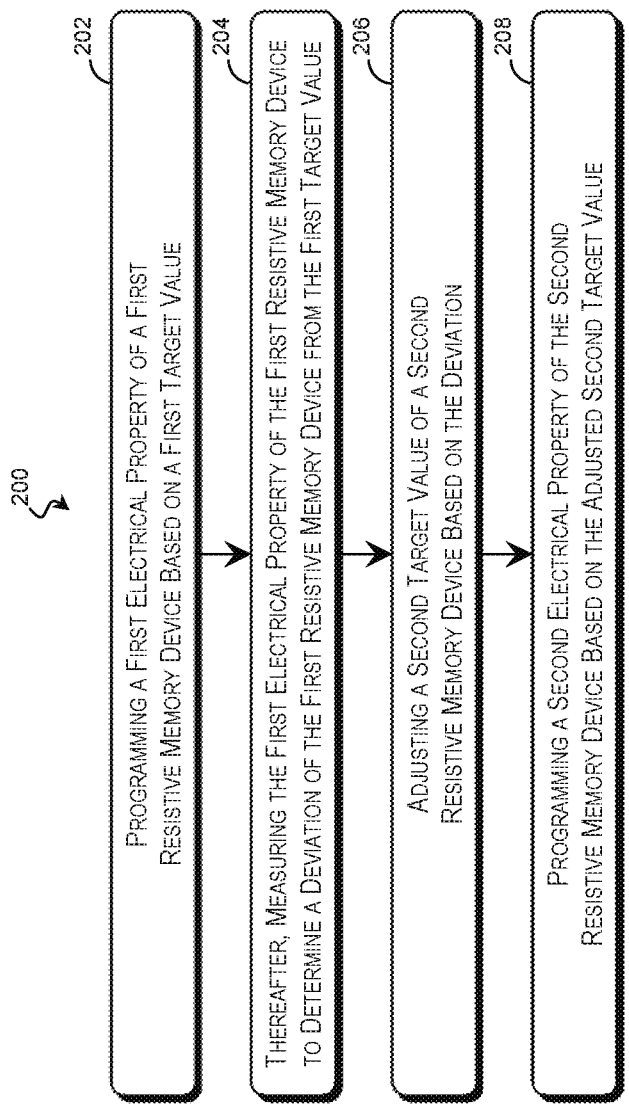
FIG. 2 is a flow diagram of a method of programming a resistive memory device according to some examples of the present disclosure.

A suitable technique for compensating for this deviation and other noise is described with reference to FIG. 2, which is a flow diagram of a method 200 of programming a resistive memory device 112 according to some examples of the present disclosure. The description of the method 200 is non-limiting, and steps may be added to and omitted from the method 200 without departing from the disclosure. Furthermore, unless noted otherwise, processes of the method 200 may be performed in any order including being performed concurrently by one or more entities.

Referring to block 202, a first electrical property, such as conductance, of a first resistive memory device (e.g., resistive memory device 112A of FIG. 1) is programmed based on a first target value. In some examples, programming the first electrical property includes applying a voltage to the first resistive memory device 112A that is greater than a write threshold. Aspects of the programming such as the polarity of the voltage, the magnitude of the voltage, and/or the amount of time during which the voltage is applied may be selected in order to approximate or achieve the first target value.

Referring to block 204, the first electrical property of the first resistive memory device 112A is measured after the programming of block 202 to determine a deviation of the measured value from the first target value. In an example where the first electrical property includes a conductance, measuring the first electrical property includes applying a read voltage to the first resistive memory device 112A and measuring current through the first resistive memory device 112A. Conductance may be determined from the current response of the first resistive memory device 112A to a particular voltage.

Referring to block 206, a second target value of a second resistive memory device (e.g., resistive memory device 112B of FIG. 1) is adjusted based on the deviation. The amount of the adjustment may be directly or inversely proportional to the amount of the deviation. Referring to block 208, a second electrical property, such as conductance, of the second resistive memory device 112B is programmed based on the adjusted second target value. This may be performed substantially as described in block 202.

Figure 3:
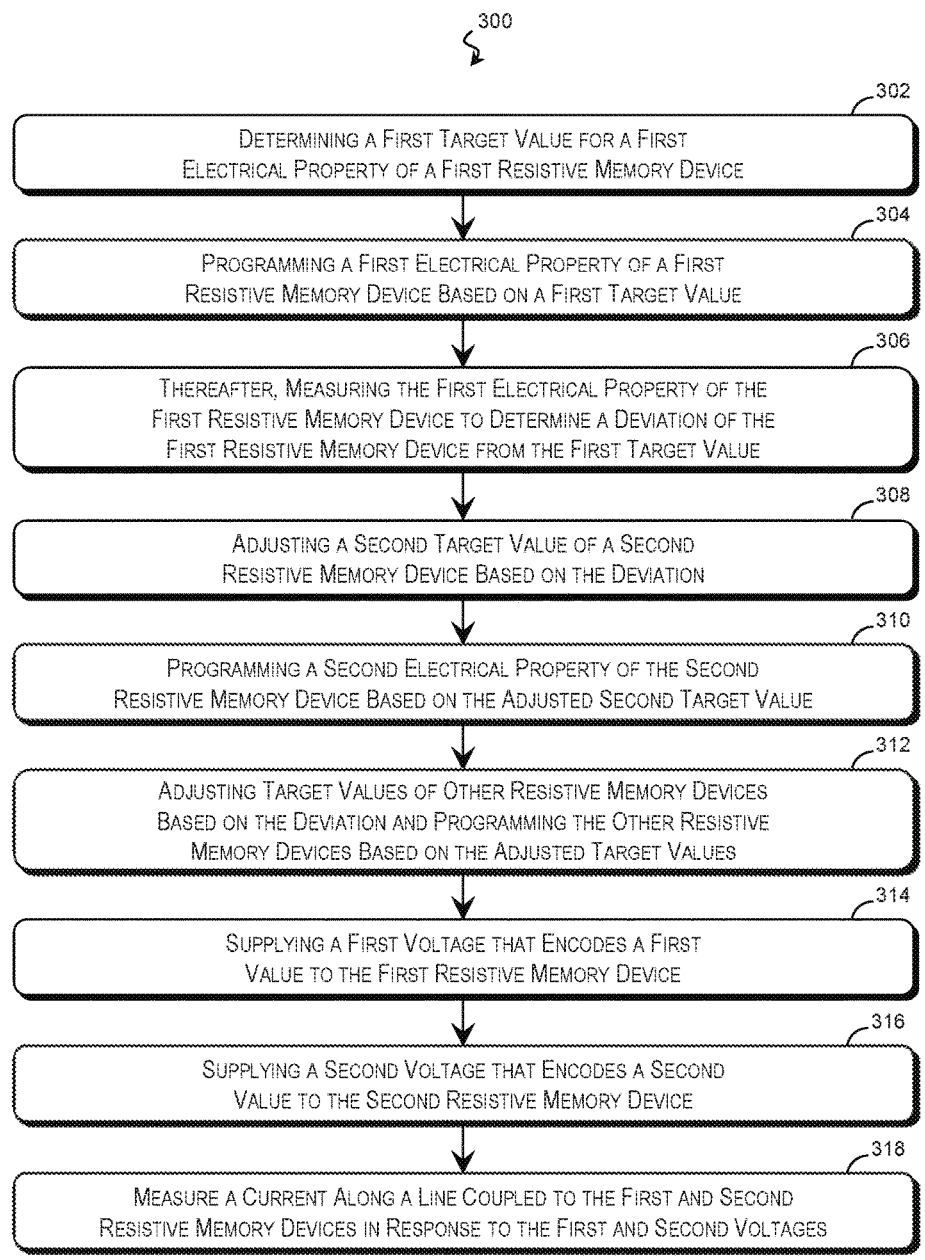
FIG. 3 is a flow diagram of a method of performing a mathematical operation using a set of resistive memory devices according to some examples of the present disclosure.
Figure 4:
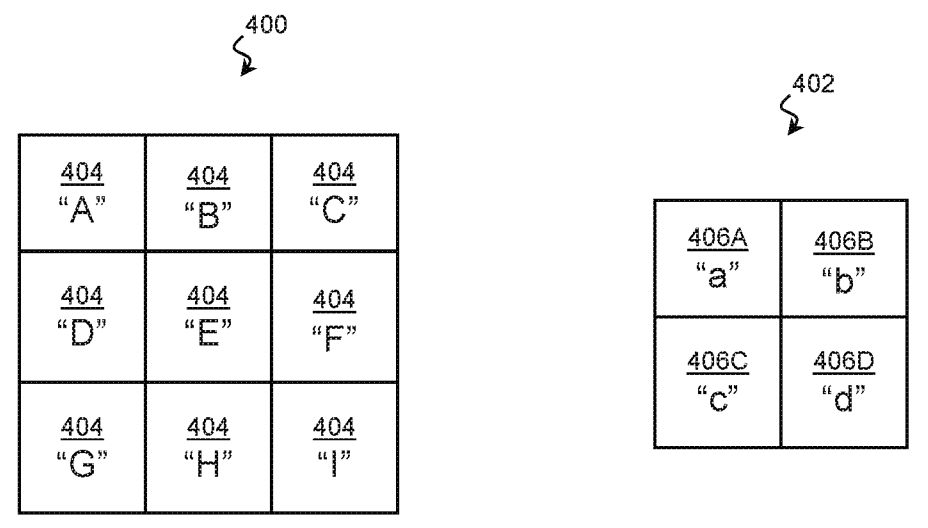
Figure 5:
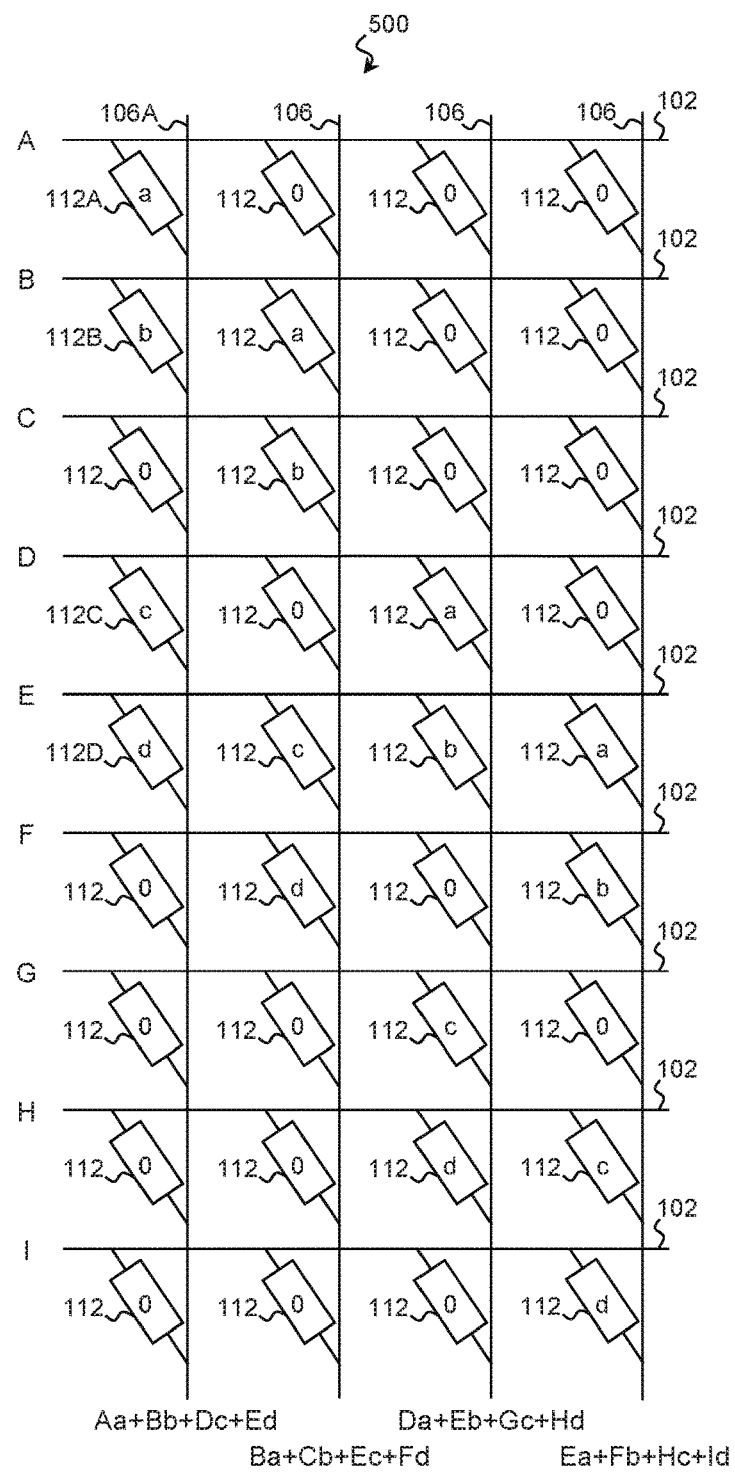
FIG. 5 is a block diagram of a crossbar circuit performing a mathematical operation according to some examples of the present disclosure.
Figure 6:
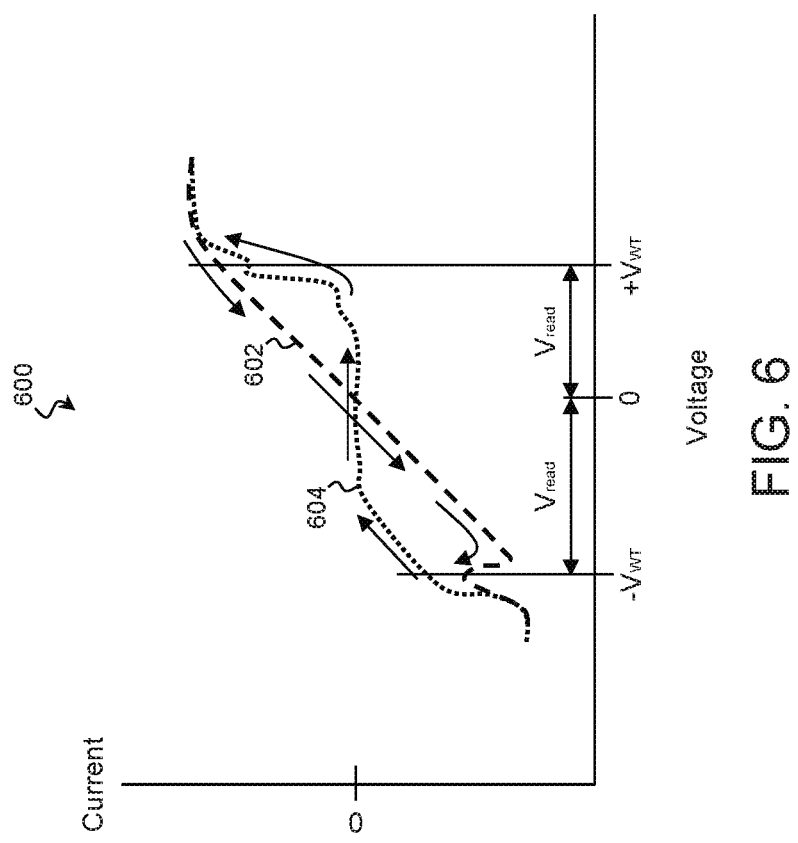
FIG. 6 is a diagram of a voltage and current relationship of a resistive memory device of a crossbar circuit according to some examples of the present disclosure.

Examples of a technique to perform a mathematical operation, such as a matrix operation, using the resistive memory devices 112 are described with reference to FIGS. 3-6. FIG. 3 is a flow diagram of the method 300 of performing the mathematical operation using the set of resistive memory devices 112 according to some examples of the present disclosure. The description of the method 300 is non-limiting, and steps may be added to and omitted from the method 300 without departing from the disclosure. Furthermore, unless noted otherwise, processes of the method 300 may be performed in any order including being performed concurrently by one or more entities. FIG. 4 is a diagram of a first matrix 400 and a second matrix 402 upon which the mathematical operation is performed according to some examples of the present disclosure. FIG. 5 is a block diagram of a crossbar circuit 500 performing the mathematical operation according to some examples of the present disclosure. The crossbar circuit 500 may be substantially similar to that of FIG. 1 and may include a first set of address lines 102, a second set of address lines 106, and a set of resistive memory devices 112 electrically coupled there between, each as described above. FIG. 6 is a diagram of a voltage and current relationship 600 of a resistive memory device 112 of the crossbar circuit 500 according to some examples of the present disclosure.

Referring first to block 302 of FIG. 3, a first target value for a first electrical property of a first resistive memory device (e.g., resistive memory device 112A of FIG. 5) is determined. The resistive memory device 112 may be used to perform a mathematical operation, and accordingly, the first target value may encode a matrix value.

To explain in more detail, a first matrix 400 and a second matrix 402 are illustrated in FIG. 4. Each matrix may be of any arbitrary size. Values of the individual elements 404 of the first matrix 400 are identified by capital letters A-I, and values of the individual elements 406 (including elements 406A, 406B, and 406D) of the second matrix 402 are identified by lower-case letters a-d.

The crossbar circuit 500 of FIG. 5 may be used to perform operations on the matrices, and to do so, the values of the elements 404 of the first matrix 400 may be encoded in voltages applied to the first set of address lines 102. The values of the elements 406 of the second matrix 402 may be encoded in conductances of the resistive memory devices 112. As current through a resistive memory device 112 is the product of the voltage and the conductance, the magnitude of a current through a resistive memory device 112 may represent the product of the respective elements of the first matrix 400 and the second matrix 402. For lines in the second set of address lines 106 that are electrically coupled to more than one resistive memory device 112, the current through the line is the sum of the current through each of the coupled resistive memory devices 112. Accordingly, the magnitude of current through such a line may represent the sum of the products calculated by the coupled resistive memory devices 112. In an example, current through address line 106A represents the product of A*a plus the product of B*b plus the product of D*c plus the product of E*d. Resistive memory devices 112 that do not contribute to the selected operation may be set to a low conductance state (e.g., about 0 siemens) or omitted entirely.

From these building blocks of multiplication and addition, more complex mathematical operations may be performed on the first matrix 400 and the second matrix 402 by the assignment of voltages to the first set of address lines 102 and conductances to the resistive memory devices 112. One example is convolution. Convolution is a mathematical operation that multiplies and sums the elements of two matrices at various orientations to produce a third matrix. Convolution has applications that include image processing, probability, statistics, computer signal processing, and differential equation solving. Referring to FIG. 5, voltages and conductances are assigned to the crossbar circuit 500 in order to perform a convolution of the first matrix 400 with the second matrix 402. Accordingly, the currents measured at the second set of address lines 106 represents the elements of a third matrix that is the convolution of the first matrix 400 with the second matrix 402.

Returning to block 302 of FIG. 3, a first target value for a first electrical property of the first resistive memory device 112A is determined that encodes a value of element 406A of the second matrix 402. In one such example, the first target value includes a conductance value with a magnitude that represents the value contained in element 406A of the second matrix 402.

Referring to block 304 of FIG. 3 and to FIG. 5, the first electrical property of the first resistive memory device 112A is programmed based on the first target value. This may be performed substantially as described in block 202. Programming the first electrical property may include applying a voltage to the first resistive memory device 112A, as shown in the voltage and current relationship 600 of FIG. 6.

In that regard, when a voltage within $\pm V_{read}$ is applied to a resistive memory device 112, the current through the device depends on the conductance state. As can be seen, the resistive memory device 112 has a first I-V segment 602 corresponding to a high conductance state and a second I-V segment 604 corresponding to a low conductance state. These are merely examples of some of the possible conductance states, and in various examples, a resistive memory device 112 may be set to any suitable conductance within a conductance range of five or more orders of magnitude to an accuracy of ±1%.

The particular conductance state may be selecting by applying a relatively higher voltage that exceeds a write threshold ($\pm V_{WT}$) to the resistive memory device 112. This may cause the device 112 to transition between states. In some examples, the final state of the resistive memory device 112 depends on the polarity of the voltage, the magnitude of the voltage, and/or the amount of time during which the voltage is applied.

However, setting a conductance state of a resistive memory device 112 to an accuracy of ±1% may involve multiple iterations of programming and verifying the conductance state. Furthermore, even setting a resistive memory device 112 to a target conductance exactly does not rule out other sources of conductance deviation such as variations in address lines, capacitive coupling between lines, etc.

Accordingly, returning to FIG. 3 and to block 306 thereof, the first electrical property of the first resistive memory device 112A is measured after the programming of block 304 to determine a deviation of the measured value from the first target value. This may be performed substantially as described in block 204 of FIG. 2. If the deviation exceeds a particular threshold, it may be addressed by repeating the programming of block 304. However, for more moderate deviations that are within the threshold, the deviation may be addressed when programming other resistive memory devices 112.

For example, referring to block 308 of FIG. 3, a second target value of a second resistive memory device 112 that encodes a value of another element 406B of the second matrix 402 is adjusted based on the deviation. This may be performed substantially as described in block 206 of FIG. 2, and the adjustment may be made to any suitable resistive memory device 112 in the crossbar circuit 500. In some such examples, the adjustment is applied to resistive memory device 112B, which encodes an immediately adjacent element 406B of the second matrix 402. In more detail, element 406B is immediately adjacent to element 406A. Therefore, a target value of resistive memory device 112B, which corresponds to element 406B, may be adjusted based on a deviation measured in resistive memory device 112A, which corresponds to element 406A.

In some examples, the adjustment is applied to a resistive memory device 112D that encoded a diagonally adjacent element 406D of the second matrix 402. In that regard, element 406D is diagonally adjacent to element 406A. Therefore, a target value of resistive memory device 112D, which corresponds to element 406D, may be adjusted based on a deviation measured in resistive memory device 112A, which corresponds to element 406A. Target values of resistive memory devices 112 for elements 406 that are not adjacent to the element 406A of the first resistive memory device 112A may also be adjusted. To eliminate loops, in some examples, a target value of a second resistive memory device 112 is adjusted if the second resistive memory device 112 has not yet been programmed but is not adjusted if the device 112 has already been programmed.

The magnitude and/or the polarity of the adjustment may depend on the measured deviation. In various examples, the second target value is adjusted by the entire amount of the deviation or fractions thereof (e.g., half of the deviation, a quarter of the deviation, etc.). In some examples, the amount of adjustment applied to the second target value has a non-linear relationship (e.g., a second order relationship or greater) with the amount of the deviation. The magnitude of the adjustment may depend on the number of neighboring matrix elements 406. For matrix elements 406 at or near edges, the amount of adjustment may be increased or decreased, and in one such example, the second target value is adjusted by half of the deviation if the first matrix element 406A has four immediately adjacent elements 406 and adjusted by the entire deviation if the first matrix element 406A has three or fewer immediately adjacent elements 406. Other adjustments may also be made to matrix elements 406 at or near boundary edges to accommodate the missing neighbors. Any adjustment may be directly or inversely proportional to the deviation, and in some examples, if the first resistive memory device 112A has a conductance that is less than the first target value, a conductance of the second target value is increased and vice-versa.

Referring to block 310 of FIG. 3, a second electrical property, such as conductance, of the second resistive memory device 112 is programmed based on the adjusted second target value. This may be performed substantially as described in block 208 of FIG. 2. Referring to block 312 of FIG. 3, the processes of blocks 308 and 310 may be repeated on other resistive memory devices 112 by adjusting the respective target values based on the deviation of the first resistive memory device 112A and programming the resistive memory devices 112 according to the adjusted target values. For example, block 312 may include adjusting a target value of a third resistive memory device 112C which corresponds to another matrix element 406C that is immediately adjacent to element 406A.

Similarly, the processes of blocks 306-312 may be repeated to measure a deviation of the second resistive memory device 112 from the adjusted second target value and to adjust the target values of other resistive memory devices 112 based on this deviation.

When the resistive memory devices 112 of the crossbar circuit 500 have been programmed, they may be used to perform the designated mathematical operation on the matrices. To do so, voltages may be applied to the first set of address lines 102 and the resultant currents may be measured on the second set of address lines 106. Referring to block 314, a first voltage that encodes a value of a first entry 404 in the first matrix 400 may be supplied to an address line 102 and thereby to the first resistive memory device 112A. Referring to block 316, a second voltage that encodes a value of a second entry 404 in the first matrix 400 may be supplied to an address line 102 and thereby to the second resistive memory device 112B. The processes of blocks 314 and/or 316 may be repeated for each entry 404 and corresponding voltage in the first matrix 400. In some examples, the voltages including the first voltage and the second voltage are applied concurrently.

Referring to block 318, current along an address line 106 electrically coupled to the first resistive memory device 112A and the second resistive memory device 112B in response to the respective voltages may be measured. As the current through the resistive memory devices 112 is the product of the read voltages and the conductances, the magnitude of the current may represent the result of performing the mathematical operation on the values encoded therein. The processes of block 318 may be repeated for each line in the second set of address lines 106 in order to perform multiple operations in parallel.

Figure 7:
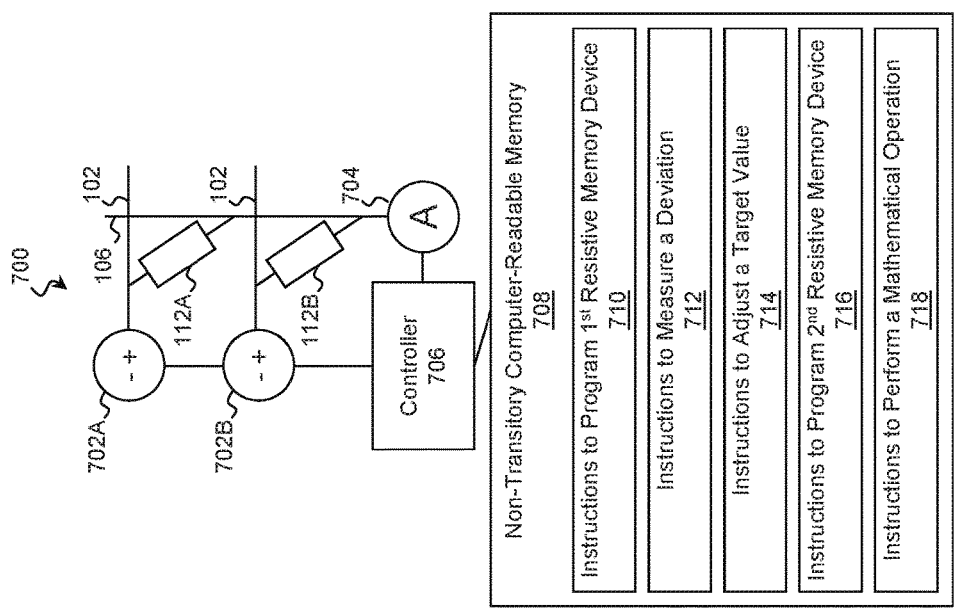
FIG. 7 is a block diagram of an integrated circuit for performing a mathematical operation using resistive memory devices according to some examples of the present disclosure.

Further examples of a suitable integrated circuit 700 are described with reference to FIG. 7. FIG. 7 is a block diagram of the integrated circuit 700 for performing a mathematical operation using resistive memory devices 112 according to some examples of the present disclosure. The integrated circuit 700 may include a first set of address lines 102, a second set of address lines 106, and a set of resistive memory devices 112, including a first resistive memory device 112A and a second resistive memory device 112B, electrically coupled between the address lines, each substantially as described above.

In some examples, the integrated circuit 700 includes a first voltage supply 702A electrically coupled to the first resistive memory device 112A and a second voltage supply 702B electrically coupled to the second resistive memory device 112B. In this manner, the first voltage supply 702A may supply a first voltage to the first resistive memory device 112A, and the second voltage supply 702B may supply a second voltage to the second resistive memory device 112B.

The first resistive memory device 112A and the second resistive memory device 112B may be electrically coupled to a common line of the second set of address lines 106, and in some such examples, the integrated circuit 700 includes an ammeter 704 electrically coupled to the common line to measure current through the first resistive memory device 112A and the second resistive memory device 112B.

The first voltage supply 702A, the second voltage supply 702B, and the ammeter 704 may each be coupled to a controller 706. The controller 706 may include any number and combination of CPUs, GPUs, microcontrollers, ASICs, FPGAs, and/or other processing resources, and may be coupled to a non-transitory computer-readable memory resource 708 that stores instructions for the controller 706. The non-transitory computer-readable memory resource 708 may include any number of non-transitory memory devices including HDDs, SSDs, other flash memory devices, optical media, battery-backed RAM, and/or other memory devices suitable for storing instructions for the controller 706. Accordingly, in various examples, the non-transitory computer-readable memory resource 708 stores instructions for performing processes of method 200 and/or method 300.

For example, referring to block 710, the non-transitory computer-readable memory resource 708 may store instructions that cause the controller 706 to program a first conductance of the first resistive memory device 112A based on a first target value. This may be performed substantially as described in block 202 of FIG. 2 and/or block 304 of FIG. 3, and to do so, the controller 706 may cause the first voltage supply 702A to apply a programming voltage to the first resistive memory device 112A that exceeds a write threshold for the device. Aspects of the programming such as the polarity of the programming voltage, the magnitude of the programming voltage, and/or the amount of time during which the programming voltage is applied may be selected in order to approximate or achieve the first target value.

Referring to block 712, the non-transitory computer-readable memory resource 708 may store instructions that cause the controller 706 to measure a deviation of the first resistive memory device 112A from the first target value. This may be performed substantially as described in block 204 of FIG. 2 and/or block 306 of FIG. 3 and may include the controller 706 causing the first voltage supply 702A to apply a read voltage to the first resistive memory device 112A and causing the ammeter 704 to measure a current through the first resistive memory device 112A in response to the read voltage.

Referring to block 714, the non-transitory computer-readable memory resource 708 may store instructions that cause the controller 706 to adjust a second target value of the second resistive memory device 112B based on the deviation. This may be performed substantially as described in block 206 of FIG. 2 and/or block 308 of FIG. 3. Referring to block 716, the non-transitory computer-readable memory resource 708 may store instructions that cause the controller 706 to program a second conductance of the second resistive memory device 1126 based on the adjusted second target value, which may be performed substantially as described in block 208 of FIG. 2 and/or block 310 of FIG. 3. In some such examples, the controller 706 causes the second voltage supply 702A to apply a programming voltage to the second resistive memory device 112B that exceeds a write threshold for the device.

Referring to block 718, the non-transitory computer-readable memory resource 708 may store instructions that cause the controller 706 to perform a mathematical operation by supplying a first voltage to the first resistive memory device 112A and the second voltage to the second resistive memory device 112B and measuring the current through the common address line 106. This may be performed substantially as described in blocks 314-318 of FIG. 3. In some examples, the first voltage represents a first entry in a first matrix and the second voltage represents a second entry in the first matrix. In some such examples, the conductance of the first resistive memory device 112A represents a first entry in a second matrix and the conductance of the first resistive memory device 112A represents a second entry in the second matrix. Accordingly, the current measured through the common address line 106 by the ammeter 704 represents a mathematical operation, such as a multiply-and-accumulate, performed on the respective matrix entries.

Figure 8:
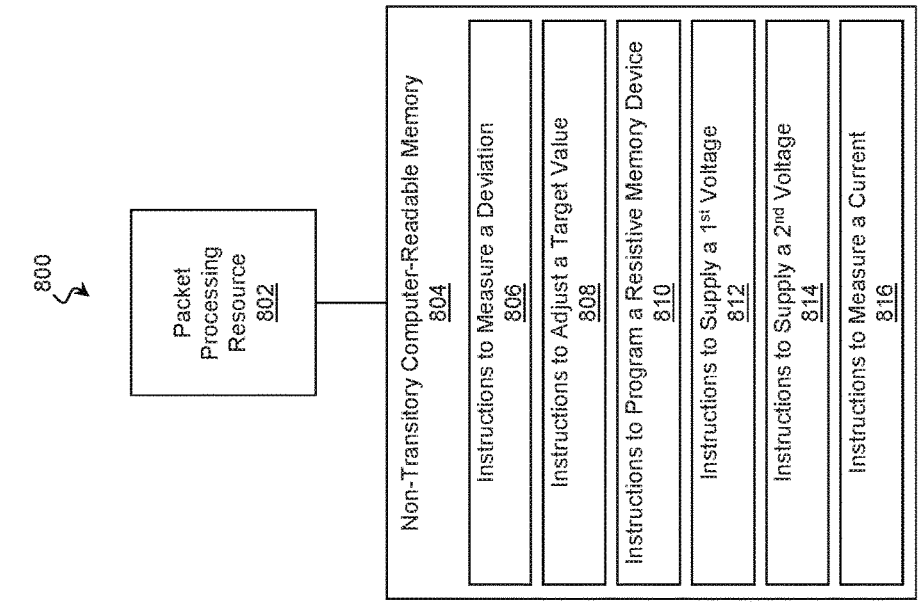
FIG. 8 is a block diagram of a system for performing a mathematical operation using resistive memory devices according to some examples of the present disclosure.

FIG. 8 is a block diagram of a system 800 for performing a mathematical operation using resistive memory devices 112 according to some examples of the present disclosure. The system 800 includes a processing resource 802 communicatively coupled to a non-transitory computer-readable memory resource 804. The processing resource 802 may include any number and combination of CPUs, GPUs, microcontrollers, ASICs, FPGAs, and/or other processing resources, and the non-transitory computer-readable memory resource 804 may include any number of non-transitory memory devices including HDDs, SSDs, other flash memory devices, optical media, battery-backed RAM, and/or other memory devices suitable for storing instructions for the processing resource 802. Accordingly, in various examples, the non-transitory computer-readable memory resource 804 stores instructions for performing processes of method 200 and/or method 300.

For example, referring to block 806, the non-transitory computer-readable memory resource 804 may store instructions that cause the processing resource 802 to measure a deviation of a first property of a first resistive memory device 112 from a first target value. This may be performed substantially as described in block 204 of FIG. 2 and/or block 306 of FIG. 3.

Referring to block 808, the non-transitory computer-readable memory resource 804 may store instructions that cause the processing resource 802 to adjust a second target value of a second resistive memory device 112 based on the deviation. This may be performed substantially as described in block 206 of FIG. 2 and/or block 308 of FIG. 3.

Referring to block 810, the non-transitory computer-readable memory resource 804 may store instructions that cause the processing resource 802 to program a second property of the second resistive memory device 112 based on the adjusted second target value. This may be performed substantially as described in block 208 of FIG. 2 and/or block 310 of FIG. 3.

Referring to block 812, the non-transitory computer-readable memory resource 804 may store instructions that cause the processing resource 802 to supply a first voltage representing a first value to the first resistive memory device 112. This may be performed substantially as described in block 314 of FIG. 3.

Referring to block 814, the non-transitory computer-readable memory resource 804 may store instructions that cause the processing resource 802 to supply a second voltage representing a second value to the second resistive memory device 112. This may be performed substantially as described in block 316 of FIG. 3.

Referring to block 816, the non-transitory computer-readable memory resource 804 may store instructions that cause the processing resource 802 to measure a current through a line electrically coupled to the first resistive memory device 112 and second resistive memory device 112 to perform a mathematical operation on the first value and the second value. This may be performed substantially as described in block 318 of FIG. 3.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A method comprising:
   attempting to program a first resistive memory device with a target first conductance;
   after attempting to program the first resistive memory device with the target first conductance, measuring an actually programmed first conductance of the first resistive memory device to determine a deviation of the actually programmed first conductance from the target first conductance;
   prior to programming a second resistive memory device, adjusting a target second conductance of the second resistive memory device to compensate for the deviation; and
   programming the second resistive memory device with the adjusted target second conductance that compensates for the deviation.

2. The method of claim 1, wherein the target first conductance and the target second conductance are each selected to perform a matrix mathematical operation.

3. The method of claim 1, wherein adjusting the target second conductance of the second resistive memory device is based on the first resistive memory device representing a first element of a matrix and the second resistive memory device representing a second element of the matrix that is immediately adjacent to the first element,
   and wherein the target second conductance is adjusted to compensate for the deviation in that the target second conductance is adjusted so that the matrix operation performed on the first element represented by the first resistive memory device and the second element represented by the second resistive memory device is correct even though the actually programmed first conductance varies from the target first conductance.

4. The method of claim 1, wherein adjusting the target second conductance of the second resistive memory device is based on the first resistive memory device representing a first element of a matrix and the second resistive memory device representing a second element of the matrix that is diagonally adjacent to the first element.

5. The method of claim 1, wherein adjusting the target second second conductance comprises adjusting the target second conductance by substantially half of the deviation.

6. The method of claim 1 comprising:
adjusting a target third conductance of a third resistive memory device to compensate for the deviation; and
programming the third resistive memory device with the adjusted target third conductance.

7. The method of claim 6, wherein adjusting the target third conductance comprises adjusting the target third conductance by about half of the deviation.

8. The method of claim 1, wherein the first resistive memory device and the second resistive memory device are electrically coupled to a common conductive line.

9. The method of claim 8, further comprising performing a multiply-and-accumulate operation by:
applying a first voltage to the first resistive memory device;
applying a second voltage to the second resistive memory device; and
measuring a current at the common conductive line.

10. A circuit comprising:
a first resistive memory device and a second resistive memory device electrically coupled to a common conductive line;
a first voltage supply to supply a first voltage to the first resistive memory device;
a second voltage supply to supply a second voltage to the second resistive memory device;
an ammeter to measure a current through the common conductive line;
a controller in communication with the first voltage supply, the second voltage supply, and the ammeter; and
a non-transitory computer-readable memory resource that stores instructions that, when executed, cause the controller to:
attempt to program a first resistive memory device with a target first conductance;
after attempting to program the first resistive memory device with the target first conductance, measure an actually programmed first conductance of the first resistive memory device to determine a deviation of the actually programmed first conductance from the target first conductance;
prior to programming a second resistive memory device, adjust a target second conductance of the second resistive memory device to compensate for the deviation; and
program the second resistive memory device with the adjusted target second conductance that compensates for the deviation; and
supply the first voltage and the second voltage and measure the current through the common conductive line to perform a mathematical operation.

11. The circuit of claim 10, wherein the mathematical operation includes a matrix operation and the target second conductance is adjusted based on the first resistive memory device representing a first element of a matrix and the second resistive memory device representing a second element of the matrix that is immediately adjacent to the first element,
and wherein the target second conductance is adjusted to compensate for the deviation in that the target second conductance is adjusted so that the matrix operation performed on the first element represented by the first resistive memory device and the second element represented by the second resistive memory device is correct even though the actually programmed first conductance varies from the target first conductance.

12. The circuit of claim 10, wherein the non-transitory computer-readable memory resource stores instructions that cause the controller to:
adjust a target third conductance of a third resistive memory device based on the deviation; and
program the third resistive memory device with the adjusted target conductance.

13. The circuit of claim 12, wherein each of the target second conductance and the target third conductance is adjusted by about half of the deviation.

14. The circuit of claim 10, wherein the mathematical operation includes a matrix multiply-and-accumulate.

15. A non-transitory computer-readable memory resource storing instructions that, when executed, cause a processing resource to:
measure an actually programmed first conductance of a first resistive memory device;
determine a deviation of the actually programmed first conductance from a target first conductance with which the first memory device was attempted to be programmed;
adjust a target second conductance of a second resistive memory device to compensate for the deviation;
program the second resistive memory device with the target second conductance;
supply a first voltage representing a first value to the first resistive memory device;
supply a second voltage representing a second value to the second resistive memory device; and
measure a current through a line electrically coupled to the first resistive memory device and the second resistive memory device to perform a mathematical operation on the first value and the second value.

16. The non-transitory computer-readable memory resource of claim 15, wherein the first value represents a first element of a matrix and the second value represents a second element of the matrix that is immediately adjacent to the first element,
and wherein the target second conductance is adjusted to compensate for the deviation in that the target second conductance is adjusted so that the matrix operation performed on the first element represented by the first resistive memory device and the second element represented by the second resistive memory device is correct even though the actually programmed first conductance varies from the target first conductance.

17. The non-transitory computer-readable memory resource of claim 15 storing instructions that, when executed, cause the processing resource to:
adjust a target third conductance of a third resistive memory device to compensate for the deviation;
program the third resistive memory device with the adjusted target third conductance; and
supply a third voltage representing a third value to the third resistive memory device.

18. The non-transitory computer-readable memory resource of claim 17, wherein the target second conductance and the target third conductance are each adjusted by about half of the deviation.

19. The non-transitory computer-readable memory resource of claim 17,
wherein the first value represents a first element of a matrix,
wherein the second value represents a second element of the matrix that is immediately adjacent to the first element, and wherein the third value represents a third element of the matrix that is immediately adjacent to the first element.

* * * * *